United States Patent
Mukai

(10) Patent No.: US 7,510,304 B2
(45) Date of Patent: Mar. 31, 2009

(54) ILLUMINATION DEVICE

(75) Inventor: Kenji Mukai, Osaka (JP)

(73) Assignee: Panasonic Corporation, Osaka (JP)

( * ) Notice: Subject to any disclaimer, the term of this patent is extended or adjusted under 35 U.S.C. 154(b) by 120 days.

(21) Appl. No.: 11/574,790

(22) PCT Filed: Sep. 7, 2005

(86) PCT No.: PCT/JP2005/016883

§ 371 (c)(1),
(2), (4) Date: Mar. 6, 2007

(87) PCT Pub. No.: WO2006/043379

PCT Pub. Date: Apr. 27, 2006

(65) Prior Publication Data

US 2008/0019134 A1    Jan. 24, 2008

(30) Foreign Application Priority Data

Oct. 21, 2004    (JP) ................ 2004-307237

(51) Int. Cl.
*F21V 29/00* (2006.01)
(52) U.S. Cl. .................. 362/294; 362/373
(58) Field of Classification Search .......... 362/294, 362/373; 361/719
See application file for complete search history.

(56) References Cited

U.S. PATENT DOCUMENTS

| | | | |
|---|---|---|---|
| 5,479,029 A | 12/1995 | Uchida et al. | |
| 6,482,520 B1 * | 11/2002 | Tzeng | 428/408 |
| 7,303,005 B2 * | 12/2007 | Reis et al. | 165/185 |
| 7,365,988 B2 * | 4/2008 | Reis et al. | 361/719 |
| 2004/0129946 A1 | 7/2004 | Nagai et al. | |
| 2004/0146707 A1 | 7/2004 | Machida et al. | |
| 2006/0087843 A1 | 4/2006 | Setomoto et al. | |
| 2008/0089069 A1 * | 4/2008 | Medendorp | 362/294 |

FOREIGN PATENT DOCUMENTS

| | | |
|---|---|---|
| DE | 196 05 302 | 8/1997 |
| JP | 56-019685 | 2/1981 |
| JP | 2000-169125 | 6/2000 |
| JP | 2000-216441 | 8/2000 |
| JP | 2004-39691 | 2/2004 |
| JP | 2004-95655 | 3/2004 |
| JP | 2004-253364 | 9/2004 |

* cited by examiner

*Primary Examiner*—Sandra L O'Shea
*Assistant Examiner*—James W Cranson
(74) *Attorney, Agent, or Firm*—Hamre, Schumann, Mueller & Larson, P.C.

(57) ABSTRACT

The present invention provides an illumination device that includes a light source (11) incorporating light emitting elements, a support member (13), an anisotropic heat conduction layer (14) formed on at least a part of a surface of the support member (13) and is configured so that a thermal conductivity thereof in a surface direction is higher than a thermal conductivity thereof in a thickness direction, and a heat radiation layer (15) formed on a part of a surface of the anisotropic heat conduction layer, and the illumination device is characterized in that the light source (11) is disposed on a part of the surface of the anisotropic heat conduction layer. This makes it possible to efficiently radiate heat generated by the light emitting elements, and provides the illumination device with high degree of freedom in designing devices that make use of the light source.

11 Claims, 4 Drawing Sheets

ILLUMINATION DEVICE

TECHNICAL FIELD

The present invention relates to an illumination device provided with a light source incorporating light emitting elements.

BACKGROUND ART

Studies on illumination devices in which light emitting elements such as light emitting diodes (LED), electroluminescence (EL) elements, etc. are used have been developed since before. Among these, an illumination device using, as a light source, a LED module obtained by mounting a plurality of LEDs on a substrate has the advantage of a long lifetime as compared with a conventional illumination device using an incandescent lamp or the like as a light source. Therefore, the foregoing device potentially may substitute for the existing illumination devices in the future.

However, since the light emitting element such as a LED emits an abundance of heat at the time of emitting light, in the case where such a light emitting element is used in an illumination device, it has been necessary to provide a heat sink (heat radiating member) on a back side of the substrate on which the light emitting element is mounted (see, for instance, JP-2004-253364-A).

FIG. 5 is a perspective view illustrating an illumination device proposed by JP-2004-253364-A. As shown in FIG. 5, an illumination device 100 has three LED modules 101, 102, and 103, a module socket 104 in which the LED modules are loaded, and a heat sink 105 attached to a back side of the module socket 104. Since the heat sink 105 is provided with fins 105a, the illumination device 100 is capable of efficiently radiating heat generated by the LED modules 101, 102, and 103.

However, the illumination device proposed by JP-2004-253364-A has a massive heat sink, and hence there is the risk that the degree of freedom in designing devices that make use of the LED modules may decrease.

DISCLOSURE OF INVENTION

In light of the foregoing circumstances, the present invention provides an illumination device that is capable of efficiently radiating heat generated from light emitting elements and has a high degree of freedom in designing devices that make use of a light source.

An illumination device of the present invention is an illumination device provided with a light source incorporating light emitting elements, and the illumination device includes:

a support member;

an anisotropic heat conduction layer formed on at least a part of a surface of the support member, a thermal conductivity in a surface direction of the anisotropic heat conduction layer being higher than a thermal conductivity thereof in a thickness direction; and a heat radiation layer formed on a part of a surface of the anisotropic heat conduction layer, wherein the light source is disposed on a part of the surface of the anisotropic heat conduction layer.

DESCRIPTION OF THE INVENTION

Figure 1A:
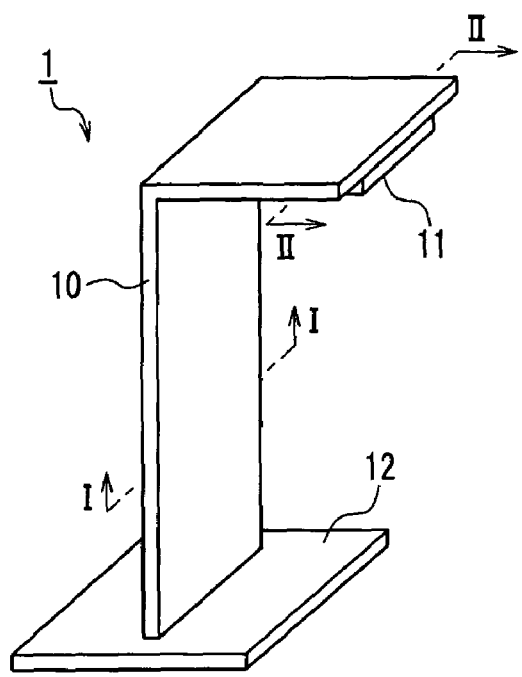
FIG. 1A is a perspective view illustrating the overall configuration of an illumination device according to Embodiment 1 of the present invention.

An illumination device of the present invention is an illumination device provided with a light source that incorporates light emitting elements. As the light emitting elements, LEDs, EL elements, etc., can be used. Among these, the LEDs are preferred, since they allow an illumination device to obtain a sufficient quantity of light, and have a long lifetime. As the light source, for instance, a light emitting module can be used that includes light emitting elements, a substrate on which the light emitting elements are mounted, and lenses that cover the light emitting elements and are fixed on the substrate. The number of the light emitting elements included in the foregoing light emitting module is not limited particularly, and may be set appropriately according to the quantity of light that the illumination device is required to emit.

The illumination device of the present invention further includes a support member, an anisotropic heat conduction layer, and a heat radiation layer. The anisotropic heat conduction layer is formed on at least a part of a surface of the support member and is configured so that a thermal conductivity thereof in a direction parallel to a surface of the layer (such a direction hereinafter is referred to simply as "surface direction") is higher than a thermal conductivity thereof in a thickness direction. The heat radiation layer is formed on a part of the surface of the anisotropic heat conduction layer. The above-described light source is disposed on a part of the surface of the anisotropic heat conduction layer. This configuration makes it possible to diffuse heat generated from the light emitting elements in the surface direction of the anisotropic heat conduction layer. Further, since the device includes the heat radiation layer formed on a part of the surface of the anisotropic heat conduction layer, it is possible to radiate efficiently the heat diffused in the surface direction of the anisotropic heat conduction layer. Still further, since a massive heat radiating member such as that described in the "Background Art" section is not needed, it is possible to provide an illumination device with a high degree of freedom in designing devices that make use of the light source.

The shape of the support member is not limited particularly, and it may be in, for instance, a plate form or a column form. The material for forming the support member is not limited particularly, either, as long as it allows the support member to support the light source. As the material, for instance, a metal such as aluminum or copper, a ceramic such as alumina or silica, etc., may be used.

The anisotropic heat conduction layer is made of a material characterized in that its thermal conductivity in a surface direction is higher than its thermal conductivity in a thickness direction. Examples of such a material include graphite. The use of graphite as a material for forming the anisotropic heat conduction layer allows for reduction of the weight of the anisotropic heat conduction layer.

To diffuse the heat generated by the light emitting elements efficiently in the surface direction of the anisotropic heat conduction layer, the thermal conductivity of the anisotropic heat conduction layer in the surface direction preferably is not less than 15 times the thermal conductivity thereof in the thickness direction. Further, the thermal conductivity of the anisotropic heat conduction layer in the surface direction preferably is not less than 200 W/(m·K), more preferably not less than 400 W/(m·K), because this makes it possible to diffuse the heat generated by the light emitting elements more efficiently.

Further, the anisotropic heat conduction layer preferably has a thickness of 50 μm to 500 μm. If the thickness is less than 50 μm, there is the risk that the durability of the anisotropic heat conduction layer may deteriorate. On the other hand, if the thickness exceeds 500 μm, there is the risk that the heat diffused in the surface direction of the anisotropic heat conduction layer may be prevented from being radiated efficiently by the heat radiation layer.

The method for forming the anisotropic heat conduction layer is not limited particularly, and the layer may be formed by, for instance, laminating an anisotropic heat conduction sheet containing graphite or the like over at least a part of a surface of the support member. Alternatively, the anisotropic heat conduction layer may be formed by preparing a material for forming the anisotropic heat conduction layer in a paste form, and applying the foregoing paste over at least a part of a surface of the support member. It should be noted that the area of the anisotropic heat conduction layer may be set appropriately according to the size of the light source used and the quantity of heat generated, and for instance, it may be set to not less than 40 times the area of the light source used.

The heat radiation layer is formed with a material that is capable of radiating heat diffused in the surface direction of the anisotropic heat conduction layer. Examples of such a material include ceramics, such as alumina, silica, etc.

Further, to radiate efficiently the heat diffused in the surface direction of the anisotropic heat conduction layer, the heat radiation layer preferably has a thermal emissivity of not less than 0.9, more preferably not less than 0.95, when its surface temperature is 100° C. It should be noted that here the "thermal emissivity" is a value indicating an intensity of infrared rays emitted from a substance with heat, which value is a ratio thereof with respect to the value of an intensity of infrared rays emitted from the ideal radiator, which is assumed to be 1.0 (the ideal radiator is a radiator that radiates 100% of all the wavelengths of the infrared rays).

Still further, the heat radiation layer preferably has a thickness of 100 μm to 500 μm. If the thickness is less than 100 μm, there is the risk that the durability of the heat radiation layer may deteriorate. On the other hand, if the thickness exceeds 500 μm, there is the risk that the heat diffused in the surface direction of the anisotropic heat conduction layer may be prevented from being radiated efficiently.

The method for forming the heat radiation layer is not particularly limited, and the layer may be formed by, for instance, laminating a heat radiation sheet containing a ceramic or the like over a part of the surface of the anisotropic heat conduction layer. Here, an adhesive layer interposed between the heat radiation layer and the anisotropic heat conduction layer preferably has a thickness of not more than 1 mm. If the thickness of the adhesive layer exceeds 1 mm, there is the risk that the heat diffused in the surface direction of the anisotropic heat conduction layer may be prevented from being radiated efficiently. Alternatively, the heat radiation layer may be formed by preparing the materials composing the heat radiation layer in a paste form, and applying the foregoing paste over a part of a surface of the anisotropic heat conduction layer. It should be noted that the portion of the surface of the anisotropic heat conduction layer on which the heat radiation layer is formed is not limited particularly, but it is preferable that the heat radiation layer is formed so as to cover an entire region of the surface of the anisotropic heat conduction layer except for a portion thereof where the light source is located, since by so doing the heat diffused in the surface direction of the anisotropic heat conduction layer can be radiated efficiently.

Further, in the case where the support member of the illumination device of the present invention is formed with a plate material having a heat-conducting property, the illumination device of the present invention may be an illumination device configured so that the anisotropic heat conduction layer is formed over both of the principal faces of the support member and the heat radiation layer covers entire regions of the surfaces of the anisotropic heat conduction layer except for a portion thereof where the light source is located. This configuration allows heat generated by the light emitting elements to be radiated efficiently, and moreover, allows the illumination device to be formed thinner. It should be noted that examples of the plate material having the heat-conducting property include a metal plate, a ceramic plate, and the like having a thermal conductivity of not less than 10 W/(m·K) and having a thickness of, for instance, 1.5 mm to 5.0 mm. Further, in the foregoing configuration, in the case where the anisotropic heat conduction layer is formed by applying an anisotropic heat conduction sheet on both of the principal faces of the support member, an adhesive layer interposed between the support member and the anisotropic heat conduction layer preferably has a thickness of not more than 1 mm. If the thickness of the adhesive layer exceeds 1 mm, there is the risk that the heat generated by the light emitting elements may be prevented from being radiated efficiently via the support member. The following describes Embodiments of the present invention in detail.

Embodiment 1

Figure 1B:
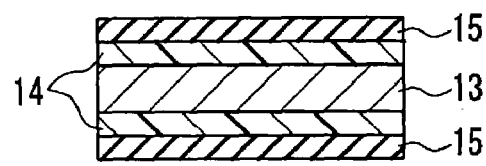
FIG. 1B is a cross-sectional view of the foregoing device taken along a line I-I shown in FIG. 1A.
Figure 1C:
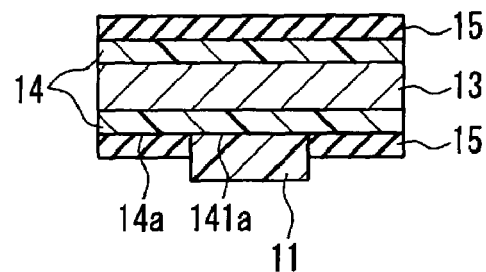
FIG. 1C is a cross-sectional view of the same taken along a line II-II shown in FIG. 1A.

First, an illumination device according to Embodiment 1 of the present invention is described with reference to the drawings as required. FIGS. 1A to 1C to be referred to are explanatory views of a stand-type illumination device according to Embodiment 1, among which FIG. 1A is a perspective view illustrating the stand-type illumination device as a whole according to Embodiment 1, FIG. 1B is a cross-sectional view of the same taken along a line I-I shown in FIG. 1A, and FIG. 1C is a cross-sectional view of the same taken along a line II-II shown in FIG. 1A.

As shown in FIG. 1A, the stand-type illumination device 1 according to Embodiment 1 includes a frame 10 formed in a reverse L-letter shape, a light source 11 incorporating light emitting elements that is fixed to an end of the frame 10, and a base 12 fixed to the other end of the frame 10 for supporting the frame 10.

As shown in FIG. 1B, the frame 10 is formed with a support member 13 having thermal conductivity, anisotropic heat conduction layers 14, and heat radiation layers 15. The anisotropic heat conduction layers 14 are formed on both principal faces of the support member 13, respectively, and are configured so that their thermal conductivity in the surface direction is higher than their thermal conductivity in the thickness direction. The heat radiation layers 15 are formed on both principal faces of the anisotropic heat conduction layers 14, respectively. Among the ends of the frame 10, the end on one side on which the light source 11 is fixed is configured, as shown in FIG. 1C, so that the heat radiation layer 15 is not formed on a portion 141a of a principal face 14a of the anisotropic heat conduction layer 14, but the light source 11 is disposed thereon. In other words, the heat radiation layers 15 cover entire regions of the surfaces of the anisotropic heat conduction layers 14 except for the portion thereof where the light source 11 is located. This allows the stand-type illumination device 1 to be configured so that heat generated by the light emitting elements incorporated in the light source 11 can be diffused in the surface direction of the anisotropic heat conduction layers 14 and the diffused heat can be radiated efficiently through the heat radiation layers 15. Further, since the stand-type illumination device 1 does not use a massive heat radiation member like that described in the "Background Art" section, it is possible to provide the device as an illumination device with a high degree of freedom in designing devices that make use of the light source 11.

Figure 2:
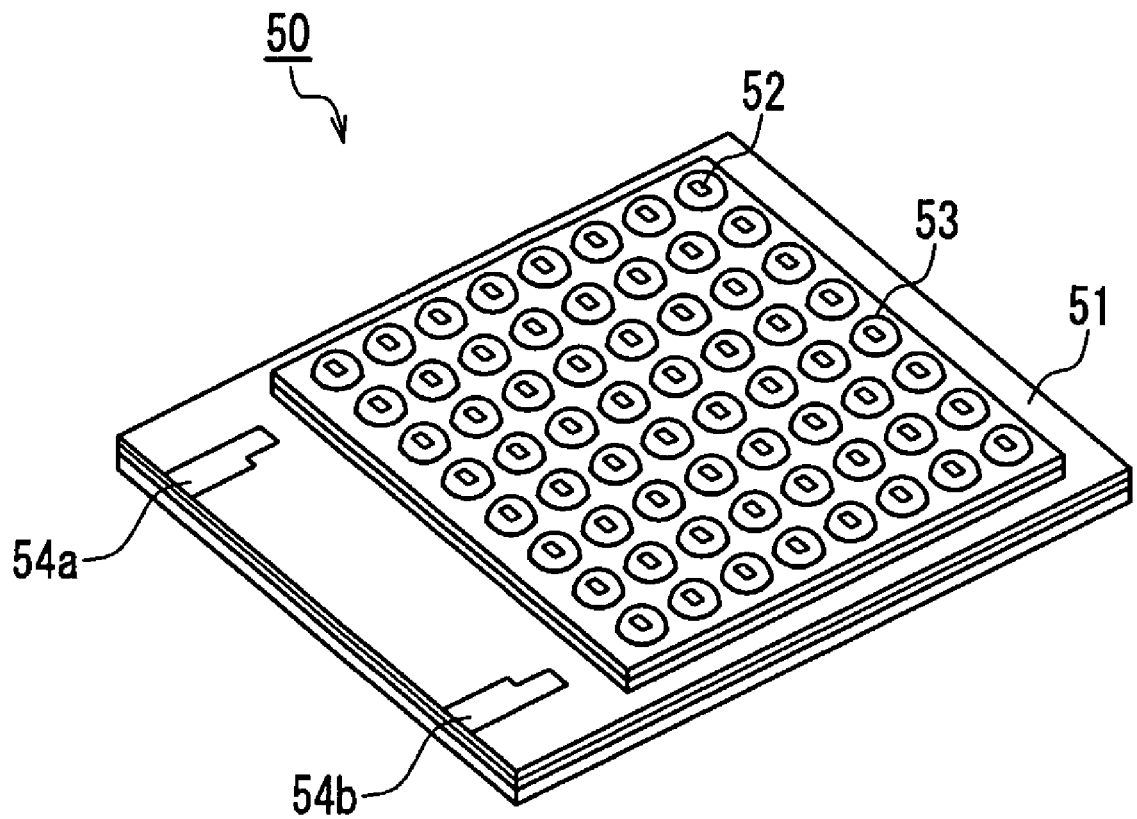
FIG. 2 is a perspective view illustrating a preferable example of a light source used in the present invention.

Next, a preferable example of the light source 11 is described. As shown in FIG. 2, as the light source 11, a LED module 50 can be used that incorporates a substrate 51, a plurality of LEDs 52 mounted on the substrate 51, lenses 53 that respectively cover the LEDs 52 and are fixed to the substrate 51, and terminals 54a and 54b formed on the substrate 51. It should be noted that in the case where the LED module 50 is fixed to an end of the frame 10 (see FIG. 1A), it may be fixed in a state such that the lenses 53 side thereof faces downward, for instance, with a socket or the like (not shown) being interposed therebetween.

Embodiment 2

Next, an illumination device according to Embodiment 2 of the present invention is described with reference to drawings as required. FIG. 3 referred to are explanatory views of a hanging-type illumination device according to Embodiment 2, among which FIG. 3A is a perspective view illustrating the hanging-type illumination device as a whole according to Embodiment 2, FIG. 3B is a cross-sectional view of the same taken along a line III-III shown in FIG. 3A, and FIG. 3C is a cross-sectional view of the same taken along a line IV-IV of FIG. 3A.

Figure 3A:
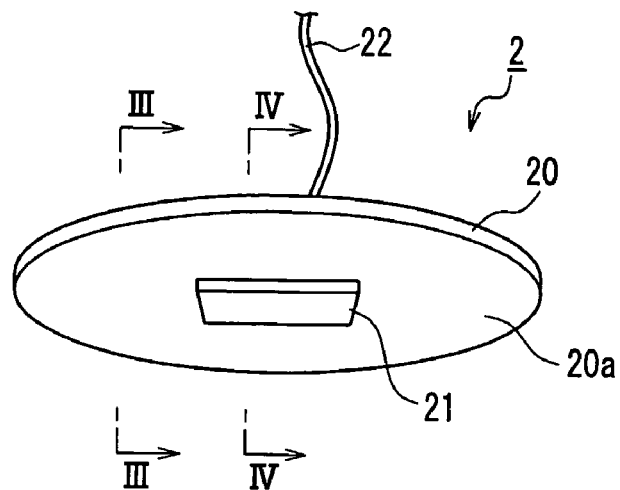
FIG. 3A is a perspective view illustrating the overall configuration of an illumination device according to Embodiment 2 of the present invention.

As shown in FIG. 3A, the hanging-type illumination device 2 according to Embodiment 2 includes a frame 20 formed in a disk shape, a light source 21, and a cord 22. The light source 21 incorporates light emitting elements and is fixed at a central portion of one principal face 20a of the frame 20. The cord 22 is mounted to a principal face of the frame 20 on a side opposite to the principal face 20a side. Further, among ends of the cord 22, the end thereof on a side opposite to the frame 20 side is fixed to, for instance, a ceiling or the like (not shown). It should be noted that as the light source 21, the LED module 50 described above (see FIG. 2), for instance, can be used.

Figure 3B:
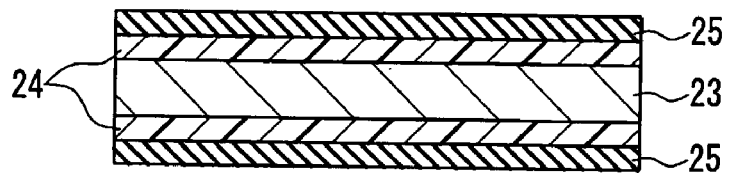
FIG. 3B is a cross-sectional view of the foregoing device taken along a line III-III shown in FIG. 3A.
Figure 3C:
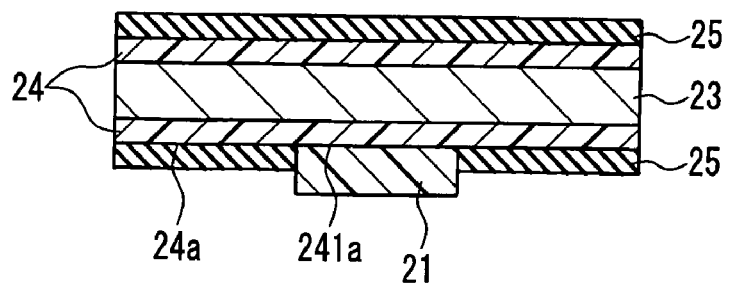
FIG. 3C is a cross-sectional view of the same taken along a line IV-IV shown in FIG. 3A.

The frame 20 is, as shown in FIG. 3B, formed with a support member 23 having thermal conductivity, anisotropic heat conduction layers 24, and heat radiation layers 25. The anisotropic heat conduction layers 24 are formed on both principal faces of the support member 23, respectively, and are configured so that their thermal conductivity in the surface direction is higher than their thermal conductivity in the thickness direction. The heat radiation layers 25 are formed on both principal faces of the anisotropic heat conduction layers 24, respectively. On the principal face 20a of the frame 20 (see FIG. 3A), as shown in FIG. 3C, at the central portion thereof at which the light source 21 is fixed, the heat radiation layer 25 is not provided on a portion 241a of a principal face 24a of the anisotropic heat conduction layer 24, but the light source 21 is disposed. In other words, the heat radiation layers 25 cover an entire region of the surfaces of the anisotropic heat conduction layers 24 except for the portion thereof where the light source 21 is located. This allows the hanging-type illumination device 2 to be configured so that heat generated by the light emitting elements incorporated in the light source 21 can be diffused in the surface direction of the anisotropic heat conduction layers 24 and the diffused heat can be radiated efficiently through the heat radiation layers 25. Further, since the hanging-type illumination device 2 uses the frame 20 formed in a disk shape (plate form), it is possible to allow the device as a whole to be formed thinner.

The following describes examples of the present invention. It should be noted that the present invention is not limited to the following examples.

Regarding the above-described hanging-type illumination device according to Embodiment 2, the heat-radiating property was evaluated. It should be noted that not a frame in a disk shape as shown in FIG. 3A but a frame in a plate form with a square outer shape was used in each example of the hanging-type illumination device subjected to the evaluation. Materials used for forming the layers of the frame used, sizes, etc., of Example 1 were as follows. The support member 23 was formed with an aluminum plate (150 mm square, thickness: 5 mm), the anisotropic heat conduction layers 24 were formed with graphite sheets manufactured by Matsushita Electric Industrial Co., Ltd (grade: PGS graphite sheet, thermal conductivity in the surface direction: 700 W/(m·K), thermal conductivity in the thickness direction: 15 W/(m·K), thickness: 100 μm), and the heat radiation layers 25 were formed with ceramic sheets ("Stick-it Flexible" manufactured by Oki Electric Industry Co., Ltd., thermal emissivity (100° C.): 0.96, thickness: 300 μm). Further, as the light source 21, the LED module 50 shown in FIG. 2 (the number of LEDs 52: 64) was used. It should be noted that as the substrate 51, a laminate composed of an aluminum layer and an electric insulation layer (an electric insulation layer containing an inorganic filler and a thermosetting resin) with a size of 2 cm square (thickness: 1.5 mm) was used. Further, as the lens 53 covering each LED 52, a lens made of a thermosetting resin with a thickness of 0.4 mm was used.

As Examples 2 to 5, hanging-type illumination devices having the same configuration as that of Example 1 described above except for the material forming the anisotropic heat conduction layers 24 were prepared. To form the anisotropic heat conduction layers 24 of Example 2, graphite sheets manufactured by TOMOE Engineering Co., Ltd. (grade: eGRAF1210, thermal conductivity in the surface direction: 120 W/(m·K), thermal conductivity in the thickness direction: 10 W/(m·K), thickness: 250 μm) were used. To form the anisotropic heat conduction layers 24 in Example 3, graphite sheets manufactured by SUZUKI SOGYO Co., Ltd. (grade: λGS, thermal conductivity in the surface direction: 185 W/(m·K), thermal conductivity in the thickness direction: 7.5 W/(m·K), thickness: 120 μm) were used. To form the anisotropic heat conduction layers 24 in Example 4, graphite sheets manufactured by TOMOE Engineering Co., Ltd. (grade: eGRAF705, thermal conductivity in the surface direction: 240 W/(m·K), thermal conductivity in the thickness direction: 6 W/(m·K), thickness: 130 μm) were used. To form the anisotropic heat conduction layers 24 in Example 5, graphite sheets manufactured by SUZUKI SOGYO Co., Ltd. (grade: Super λGS, thermal conductivity in the surface direction: 300 W/(m·K), thermal conductivity in the thickness direction: 17.5 W/(m·K), thickness: 120 μm) were used.

Further, as a Comparative Example, a hanging-type illumination device configured with the same components as those of Examples 1 to 5 described above except for the frame was prepared. In Comparative Example, only a heat sink ("EH52-70" manufactured by MIZUTANI ELECTRIC INDUSTRY Co., Ltd., 52×40 mm, thickness: 70 mm) was used as the frame.

The evaluation of the heat-radiating property was performed as follows. As to each of Examples 1 to 5 and Comparative Example described above, the sixty-four LEDs 52 were lit with a current of 40 mA running therethrough, and a surface temperature of the lenses 53 of the LED module 50 (see FIG. 2) was detected by using a thermocouple in one-second intervals during 60 minutes from the start of lighting, and the surface temperature when the temperature variation was stabilized was referred to for the evaluation. It should be noted that the foregoing detection of the surface temperature was carried out in a state in which each hanging-type illumination device was suspended with the cord 22 (see FIG. 3A) from the ceiling so that a distance between the LED module 50 and a face of a desk (not shown) disposed vis-a-vis the LED module 50 was 50 cm. Besides, the ambient temperature of the LED 50 was kept at 25° C. during the detection. The results are shown in FIG. 4.

Figure 4:
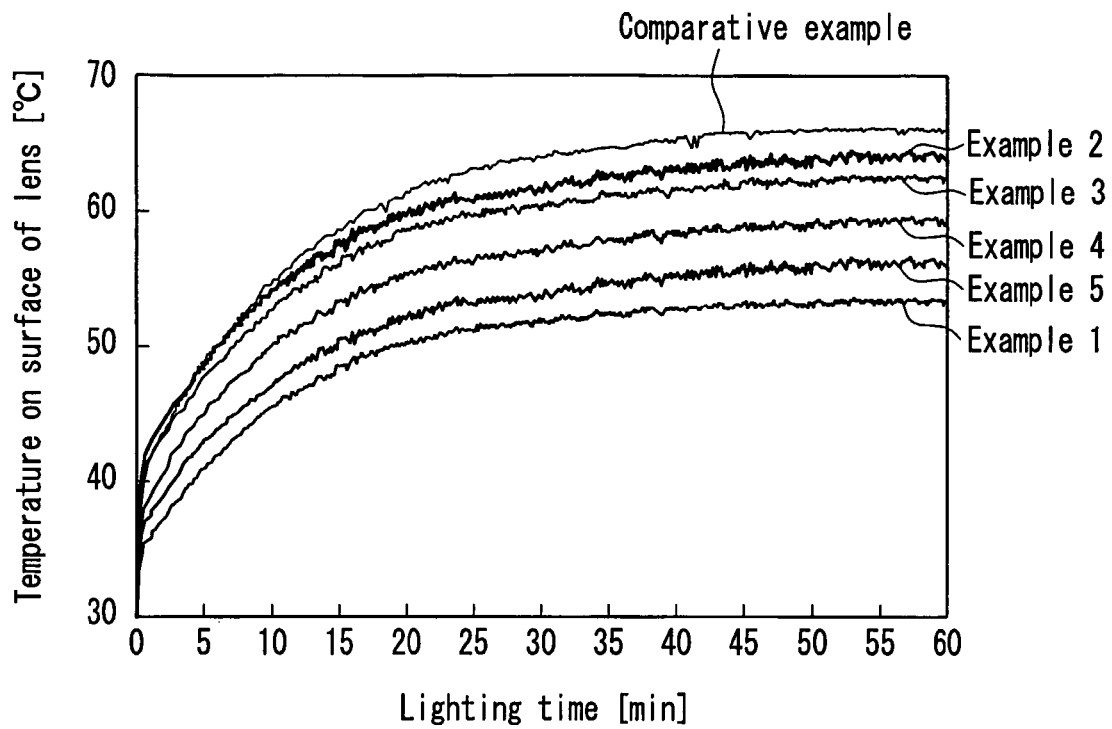
FIG. 4 is a graph showing how surface temperatures of lenses of Examples of the present invention and a Comparative Example varied while the devices were lit up.
Figure 5:
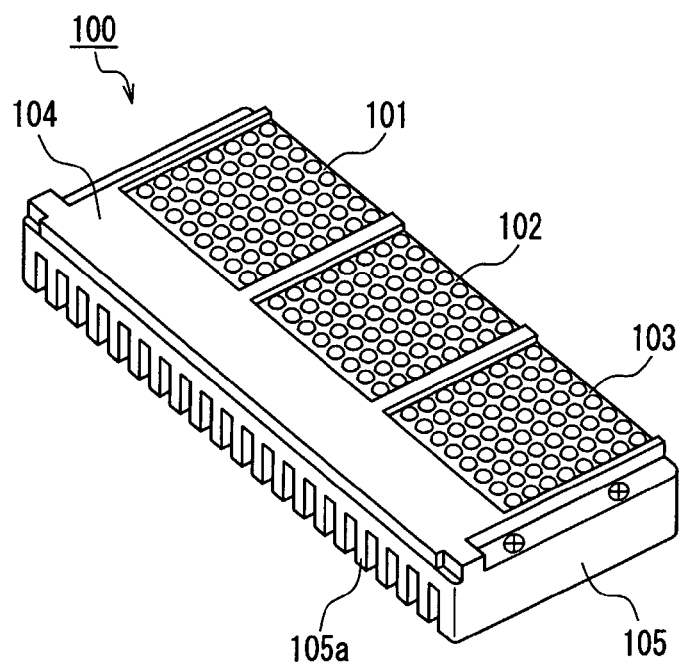
FIG. 5 is a perspective view illustrating a conventional illumination device.

As shown in FIG. 4, the surface temperatures of the lenses 53 of Examples 1 to 5 of the present invention were stabilized at lower degrees as compared with Comparative Example. These results made it clear that the illumination device of the present invention allows heat generated from the light emitting elements to be radiated efficiently. Particularly, Examples 1, 4, and 5, each of which used the anisotropic heat conduction layers 24 having a thermal conductivity in the surface direction that was not less than 15 times the thermal conductivity thereof in the thickness direction (hereinafter this condition is referred to as "condition 1") and that was not less than 200 W/(m·K) (hereinafter this condition is referred to as "condition 2"), exhibited the stabilization of the surface temperatures at degrees not higher than 60° C. Particularly, Example 1, which used the anisotropic heat conduction layers 24 having the thermal conductivity in the surface direction of not less than 400 W/(m·K), exhibited the stabilization of the surface temperature at the lowest degree (not higher than 55° C.). Further, Example 3, which used the anisotropic heat conduction layers 24 satisfying the condition 1 but not satisfying the condition 2, exhibited the stabilization of the surface temperature at a lower degree as compared with Example 2, which used the anisotropic heat conduction layers 24 satisfying neither of the conditions 1 and 2.

INDUSTRIAL APPLICABILITY

The present invention is applied usefully in an illumination device used in, for instance, ordinary illuminations, presentation illuminations (sign lights, etc.), automotive illuminations (particularly, headlights), etc.

The invention claimed is:

1. An illumination device provided with a light source incorporating light emitting elements, comprising:
   a support member;
   an anisotropic heat conduction layer formed on at least a part of a surface of the support member, a thermal conductivity in a surface direction of the anisotropic heat conduction layer being higher than a thermal conductivity thereof in a thickness direction; and
   a heat radiation layer formed on a part of a surface of the anisotropic heat conduction layer,
   wherein the light source is disposed on a part of the surface of the anisotropic heat conduction layer.

2. The illumination device according to claim 1, wherein the heat radiation layer covers an entire region of the surface of the anisotropic heat conduction layer except for the part of the same where the light source is located.

3. The illumination device according to claim 1, wherein the support member is formed with a plate material having a heat-conducting property,
   the anisotropic heat conduction layer is formed on both principal faces of the support member, and
   the heat radiation layer covers an entire region of the surface of the anisotropic heat conduction layer except for the part of the same where the light source is located.

4. The illumination device according to claim 1, wherein the thermal conductivity in the surface direction of the anisotropic heat conduction layer is not less than 15 times the thermal conductivity thereof in the thickness direction.

5. The illumination device according to claim 1, wherein the thermal conductivity in the surface direction of the anisotropic heat conduction layer is not less than 200 W/(m·K).

6. The illumination device according to claim 1, wherein the anisotropic heat conduction layer has a thickness in a range of 50 μm to 500 μm.

7. The illumination device according to claim 1, wherein the anisotropic heat conduction layer contains graphite.

8. The illumination device according to claim 1, wherein the heat radiation layer has a thermal emissivity of not less than 0.9 when a surface temperature thereof is 100° C.

9. The illumination device according to claim 1, wherein the heat radiation layer has a thickness in a range of 100 μm to 500 μm.

10. The illumination device according to claim 1, wherein the heat radiation layer contains a ceramic.

11. The illumination device according to claim 1, wherein the light source includes:
    a substrate on which the light emitting elements are mounted; and
    lenses that cover the light emitting elements, respectively, and
    are fixed on the substrate.

* * * * *